(12) United States Patent
Kostiew et al.

(10) Patent No.: US 8,163,598 B2
(45) Date of Patent: Apr. 24, 2012

(54) CLIPLESS INTEGRATED HEAT SPREADER PROCESS AND MATERIALS

(75) Inventors: George Kostiew, Chandler, AZ (US); Raj Bahadur, Gilbert, AZ (US); James Mellody, Phoenix, AZ (US); George Vakanas, Tempe, AZ (US); Leonel Arana, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/006,541

(22) Filed: Jan. 14, 2011

(65) Prior Publication Data

US 2011/0129963 A1    Jun. 2, 2011

Related U.S. Application Data

(62) Division of application No. 12/130,822, filed on May 30, 2008, now Pat. No. 7,892,883.

(51) Int. Cl.
*H01L 21/50* (2006.01)
*H01L 21/48* (2006.01)
*H01L 21/44* (2006.01)

(52) U.S. Cl. ........... 438/106; 438/15; 438/118; 438/119; 438/122; 257/E21.499; 257/E21.506; 257/E21.514; 257/E21.519

(58) Field of Classification Search ............ 257/E21.499, 257/E21.506, E21.514, E21.519
See application file for complete search history.

(56) References Cited

U.S. PATENT DOCUMENTS

| | | | |
|---|---|---|---|
| 5,477,008 A | 12/1995 | Pasqualoni et al. | |
| 2003/0178730 A1 | 9/2003 | Rumer et al. | |
| 2007/0138621 A1* | 6/2007 | Sane et al. | 257/704 |
| 2007/0284730 A1 | 12/2007 | Shi et al. | |
| 2008/0116589 A1 | 5/2008 | Li et al. | |
| 2008/0237841 A1* | 10/2008 | Arana et al. | 257/712 |
| 2009/0179322 A1 | 7/2009 | Furman et al. | |
| 2009/0286359 A1* | 11/2009 | Gektin et al. | 438/122 |
| 2009/0298235 A1 | 12/2009 | Kostiew et al. | |

FOREIGN PATENT DOCUMENTS

KR    2002046308 A    6/2002

* cited by examiner

*Primary Examiner* — Mohsen Ahmadi
(74) *Attorney, Agent, or Firm* — Cool Patent, P.C.; Joseph P. Curtin

(57) ABSTRACT

In one or more embodiments, a method comprising applying thermo compression to a package assembly including a lid, a die, and a package substrate to assemble the package assembly is disclosed. The method may include assembling the package assembly without coupling a biasing mechanism to the lid. Heat may be applied to a bond head coupled with a pick and place tool. Heat may be applied to a bond stage coupled to a carrier for holding the package assembly during processing. An adhesive applied to the lid or package substrate may be allowed to at least partially cure. The method may further include, in an oven, reflowing a thermal interface material (TIM) coupled to the lid and the die, curing the TIM, and/or curing the adhesive, without using clips.

6 Claims, 6 Drawing Sheets

CLIPLESS INTEGRATED HEAT SPREADER PROCESS AND MATERIALS

BACKGROUND

As semiconductor technology advances, microelectronic devices such as processors are decreasing in size while achieving greater speed and performance. As a result, power density increases, and more heat is generated within a smaller area. Excessive heat degrades processor performance and reduces component reliability. Sufficient heat removal is needed to keep up with advances in technology.

A heat spreader is commonly coupled to a processor to increase surface area for heat dissipation. The process for attaching the heat spreader to the processor package may use clips to hold the heat spreader in place while the sealant cures and may involve many steps.

BRIEF DESCRIPTION OF THE DRAWINGS

The claimed subject matter will be understood more fully from the detailed description given below and from the accompanying drawings of disclosed embodiments which, however, should not be taken to limit the claimed subject matter to the specific embodiment(s) described, but are for explanation and understanding only.

DETAILED DESCRIPTION

Figure 1:
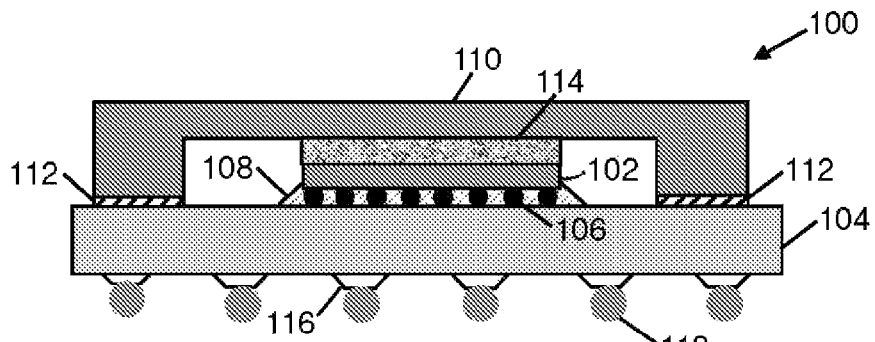
FIG. 1 is a cross-sectional view of a package assembly according to one embodiment.

Referring to FIG. 1, a cross-sectional view of a package assembly according to one embodiment is shown at 100. The package assembly 100 may include an integrated circuit (IC), die or chip 102 coupled to a package substrate 104 using a set of connectors such as controlled collapse chip connect (C4) bumps 106. Alternatively, other types of connectors in electrical connection systems may be used. In addition, an underfill material 108 may be applied to fill the gap between the die 102 and the package substrate 104, and cured. The underfill 108 may include an epoxy-based material.

The die 102 may be a microprocessor, microcontroller, application specific integrated circuit (ASIC), field programmable gate array (FPGA), digital signal processor (DSP), memory, input/out (I/O) controller or hub, etc. The package substrate 104 has connections (not shown) to the die 102 coupled to ground, power and signaling planes within the package substrate 104. The package substrate 104 may be formed from any rigid dielectric substrate, such as a standard printed circuit board (PCB) material. For example, the package substrate material may include FR-4 epoxy-glass, polyimide-glass, benzocyclobutene, bismaleimide triazine (BT), other epoxy resins, injection-molded plastic or the like, and ceramic.

The package assembly 100 may be a chip carrier capable of protecting the die 102 and may include a lid 110 coupled to the package substrate 104. The lid 110 may be thermally coupled to the die 102 and capable of functioning as a heat spreader due to the increased surface area for dissipating heat that is generated by die 102. The lid 110 may form an internal enclosure to surround and protect the die 102 against the external environment. The lid 110 may be hermetically sealed to the package substrate 104. In one embodiment, the lid 110 may be an integrated heat spreader (IHS) with a casing made from aluminum, copper, copper alloy, ceramic, carbon fiber and/or other suitable material capable of covering the die 102 and dissipating heat. The lid 110 may further be coated with nickel.

To couple the lid 110 with the package substrate 104, an adhesive 112 may be disposed in between and cured using thermo compression. As used herein, "thermo compression" may be defined as the simultaneous application of heat and force. The degree of heat and force may vary depending on other parameters and may come from different sources. For example, heat may be applied to the top and/or bottom of the adhesive 112, as further described below.

In one embodiment, the adhesive 112 is a quick-cure adhesive capable of fully curing in approximately 2 seconds to approximately 30 minutes. Partial curing of the adhesive 112 may occur in less time and allows the lid 110 and package substrate 104 to be bonded together sufficiently such that the lid 110 does not shift as the adhesive 112 cures. The bond between the lid 110 and package substrate 104 may strengthen as full curing of the adhesive 112 completes. In one embodiment, the adhesive 112 may be considered fully cured when the application of heat or pressure and/or the passage of time no longer result in any chemical or physical changes in the adhesive 112.

When partially or fully cured, the adhesive 112 may withstand humidity, temperature cycling, and/or other operating conditions of the package assembly 100. The adhesive 112 may include microelectronic adhesives such as Dow Corning EA-6800 and EA-6900, available from Dow Corning Corporation, Midland, Mich., U.S.A., but the claimed subject matter is not limited in this respect. The adhesive 112 may also be referred to herein as "sealant". Other characteristics of the adhesive 112 are disclosed below.

A thermal interface material (TIM) 114 may be applied between the lid 110 and the die 102 to minimize thermal resistance. The TIM 114 may also have adhesive properties to bond the lid 110 and the die 102 together. TIM 114 may include solder TIM (STIM), polymeric TIM (PTIM), polymer-solder hybrid TIM (PSH TIM), and elastomeric TIM (eTIM). Examples of TIM 114 may include polymer gel, polymer solder, thermal grease including silicone oil with aluminum oxide, zinc oxide, boron nitride, colloidal silver, etc. TIM 114 may also include thermally conductive material such as metallic foil, metal-impregnated paste, metal or polymer solder, etc. In addition, STIM may be formed from bismuth (Bi), tin (Sn), indium (In), silver (Ag), lead (Pb), gold (Ag), copper (Cu), antimony (Sb), cadmium (Cd), and/or other suitable materials, but the claimed subject matter is not limited these respects.

In one embodiment, TIM 114 may be a preform that can be picked and placed. For example, solder or polymer-solder preform may be heated to form a liquid so that the TIM 114 is evenly distributed on the die side of the lid 110 (under the lid) and/or the back side (top surface) of the die 102.

Further, in one embodiment, the die side of the lid 110 may include a layer of suitable solder-wettable material such as gold, copper, or nickel for application of STIM. The back side of the die 102 may also include a layer of solder-wettable material for application of STIM. The wettability of a surface may also be enhanced by the application of flux, which helps to prevent oxide formation.

It should be noted that any reference to back side or front side is not limited to that which is shown. For example, the back side of die 102 may refer to a secondary side of die 102 in general, and not limited to the top surface of die 102. These references may be useful, for example, if the die 102 was oriented vertically or in such a way that the top and bottom surfaces are not easily distinguishable. However, although the terms back side, bottom surface, beneath, under, below, etc. and/or front side, top surface, above, top, etc., may be used herein for purposes of discussion, the claimed subject matter is not limited in these respects.

Package assembly 100 may include a bottom surface with contact pads 116 for coupling to a PCB (not shown). The PCB may be a conventional PCB, a printed wiring board (PWB), a motherboard, a daughtercard, a cartridge substrate, a flex-board or any other substrate which may carry the package assembly 100. In one embodiment, the PCB may carry a CPU, memory controller hub (MCH), I/O controller hub (ICH), universal serial bus (USB) hub, read-only memory (ROM), flash memory, graphics controller, super I/O (SIO) port, integrated drive electronics (IDE) bus, peripheral component interconnect (PCI) bus, accelerated graphics port (AGP) bus, low pin count (LPC) bus, one or more peripheral devices, integrated device such as a system on a chip (SOC), and/or other components. The package assembly 100 may be coupled to the PCB via solder balls 118, or alternatively, pins or other connectors. The package assembly 100 may have a different configuration from that of FIG. 1. For example, packaging technology such as pin grid array (PGA), ball grid array (BGA), land grid array (LGA), column grid array (CGA), and any of a variety of solder reflow technologies may be used to couple package assembly 100 to the PCB.

As a second level of cooling, a heat sink (not shown) may be placed on top of the lid 110 to dissipate heat. Other components may be coupled with and/or used together with the lid 110 to increase cooling.

According to one embodiment, the package assembly 100 may be created using a method in which the IHS 110 is coupled with a die 102 and package substrate 104 without the use of biasing mechanisms or clips coupled with the IHS 110 during cure and/or reflow processes. The method of coupling the IHS 110 with the die 102 and package substrate 104 may also be referred to as "IHS-attach process", as further described below.

Figure 2:
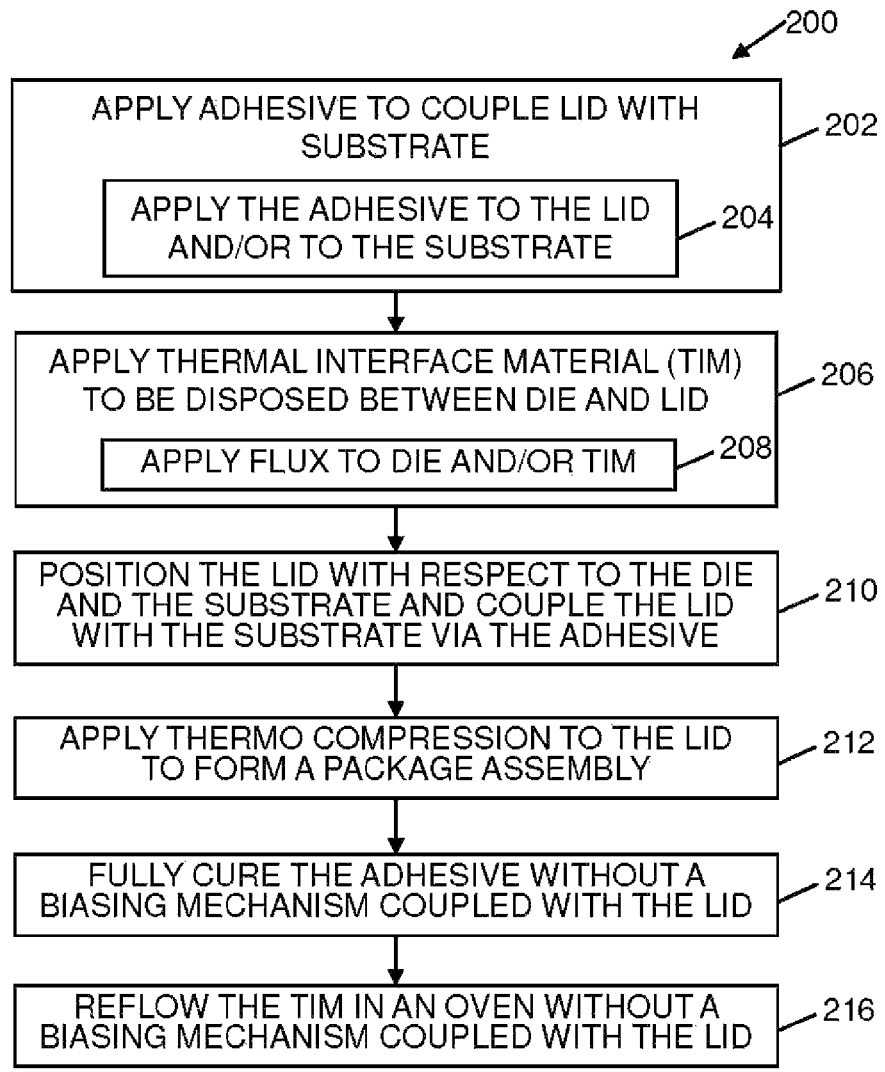
FIG. 2 is a flowchart of a method of forming a package assembly according to one embodiment.

Referring now to FIG. 2, a flowchart of a method of forming a package assembly according to one embodiment is shown at 200. Method 200 includes, at 202, applying an adhesive to couple a lid with a package substrate which is coupled with a die. At 204, the method 200 may dispense the adhesive onto the lid and/or the package substrate. In one embodiment, the adhesive is placed such that when the adhesive cures, the die is hermetically sealed inside the lid and package substrate assembly. In one embodiment, sufficient adhesive may be applied to the lid and/or package substrate to allow the lid and package substrate to be bonded together so that applied thermo compression sufficiently holds the lid in place during cure and/or reflow processes, but does not hermetically seal the die inside the lid and package substrate assembly.

At 206, method 200 includes applying a thermal interface material (TIM) to be disposed between a first side of a die and a first side of the lid. The first side of the die may be the back side while the first side of the lid may be the die side or bottom surface of the lid. The TIM that is selected for use may be of a solder, polymer-solder, or other solder-hybrid variety (STIM) and the method 200 may include applying flux at 208. Flux may be applied to the die, the STIM, and/or the lid to prevent oxide formation and improve wettability. For example, prior to application of an STIM, flux may be applied on top of the back side of the die. After application of the STIM, flux may be applied on top of the STIM. Flux may be sprayed onto a desired surface. In one embodiment, a flux film from flat sheet stock or roll sheet stock from a reel may be picked and placed on a desired surface. Flux may not be needed when other varieties of TIM, such as PTIM and eTIM, are used.

Method 200 further includes, at 210, positioning the lid with respect to the die and the package substrate and coupling the lid with the package substrate via the adhesive which was previously applied intermediate the lid and package substrate. The adhesive may be on the lid or on the package substrate. Positioning and coupling of the lid may be performed using a pick and place tool ("PPL tool") as described further below.

At 212, the method 200 includes applying thermo compression to a second side of the lid to form a package assembly. A predetermined amount of heat and force is applied to the top surface of the lid by the PPL tool, as further described below. Thermo compression may be applied for a period of time lasting from when force (from the PPL tool) is applied to until when force is removed from the lid, also referred to as "dwell time". Block 212 may include additional steps, as further described in FIG. 3 below.

Figure 3:
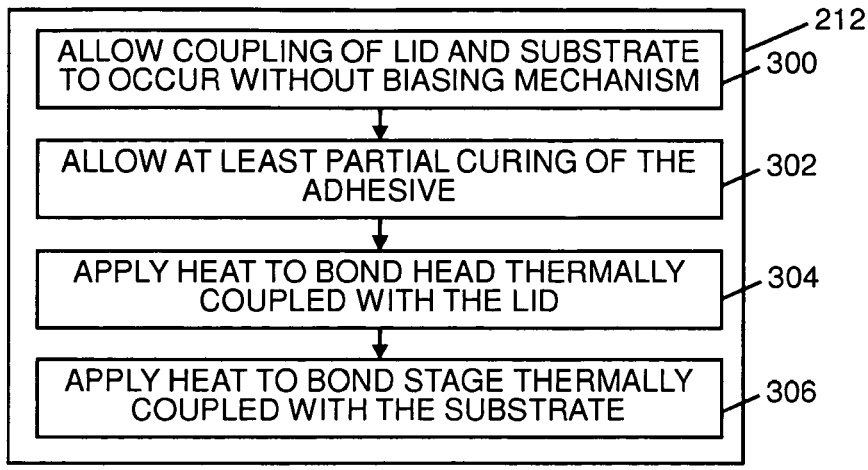
FIG. 3 shows block 212 of FIG. 2 in more detail.

Turning now to FIG. 3, block 212 of FIG. 2 is shown in more detail. Applying thermo compression at 212 may further include, at 300, allowing coupling of the lid and the package substrate to occur without a biasing mechanism such as a clip, fastener, spring, or the like. At 302, the application of thermo compression may allow at least partial curing of the adhesive. By allowing partial curing of the adhesive, the bond (created by the adhesive) between the lid and the package substrate may be sufficiently strong that the biasing mechanism is not needed to hold the lid in place as the adhesive fully cures. The adhesive may be a quick-cure adhesive capable of fully curing in approximately 2 seconds to 30 minutes, and partial curing may require less time. Block 212 may further include, at 304, applying heat to a bond head thermally coupled with the lid and, at 306, applying heat to a bond stage thermally coupled with the package substrate. The bond head and the bond stage are further described below.

Returning to FIG. 2, method 200 may further include, at 214, fully curing the adhesive without a biasing mechanism coupled with the lid to hold the lid in place. As mentioned above, from the application of thermo compression, at least partial curing of the adhesive may have occurred and the bond between the lid and the package substrate may be sufficiently strong that the biasing mechanism is not needed to hold the lid in place as the adhesive fully cures.

Method 200 may further include, at 216, reflowing the TIM in an oven without a biasing mechanism coupled with the lid to hold the lid in place. The reflow process may be used to eliminate bubbles and voids in an STIM. The reflow process may use reflow methods including conduction, infrared, vapor phase, hot gas, convection, induction, resistance, laser, etc. Similarly to 214, the application of thermo compression may allow at least partial curing of the adhesive and therefore, the bond between the lid and the package substrate may be sufficiently strong that the biasing mechanism is not needed to hold the lid in place during the reflow process.

Method 200 may further include, at 218, fully curing the TIM without a biasing mechanism coupled with the lid to hold the lid in place. The curing process may occur in a convection oven. In a method using PTIM or other non-solder TIM, a reflow process may not be needed. Similarly to 214 and 216, the application of thermo compression may allow at least partial curing of the adhesive and therefore, the bond between the lid and the package substrate may be sufficiently strong that the biasing mechanism is not needed to hold the lid in place during the full-curing process.

Figure 4:
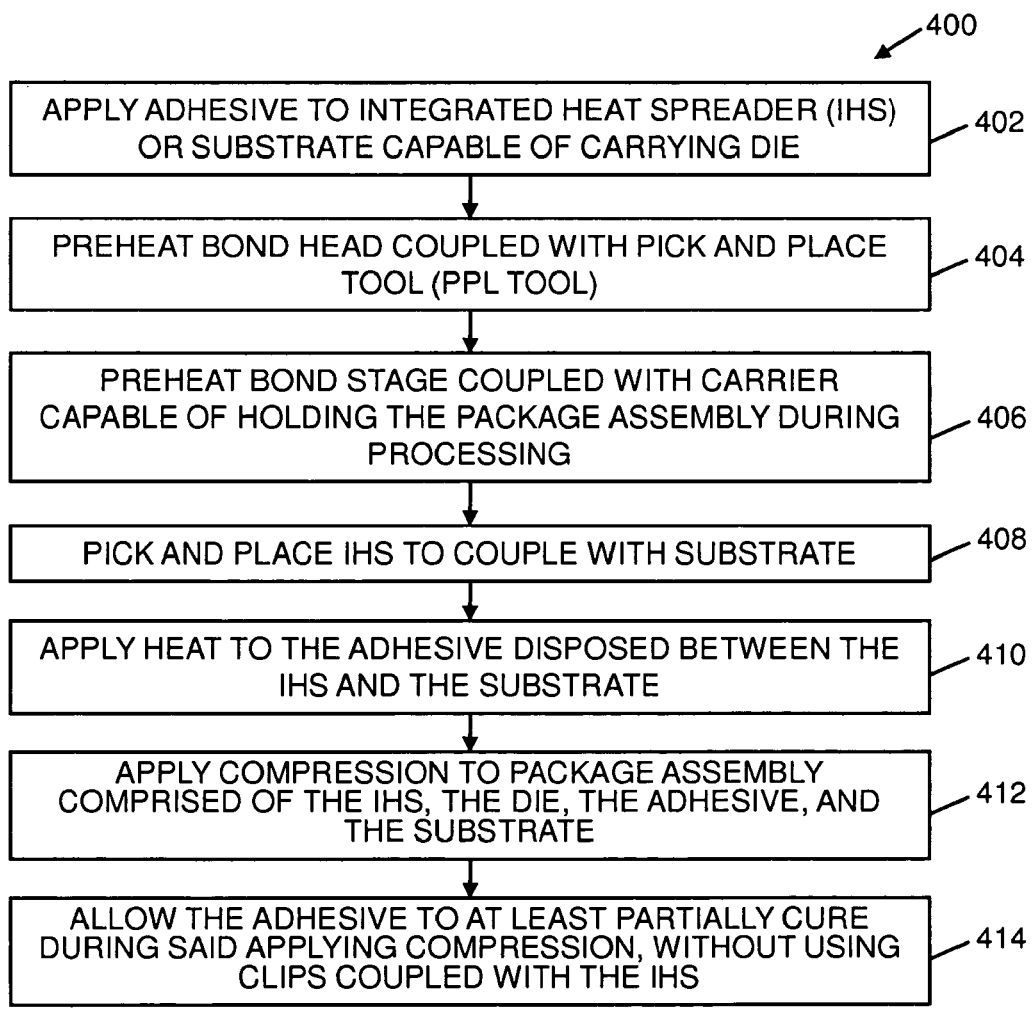
FIG. 4 is a flowchart of a method of forming a package assembly according to another embodiment.

Referring now to FIG. 4, a flowchart of a method of forming a package assembly according to another embodiment is shown at 400. The method 400 includes, at 402, applying an adhesive to an integrated heat spreader (IHS) or a package substrate capable of carrying a die. The adhesive may be a quick-cure adhesive such as a sealant capable of fully curing in approximately 2 seconds to approximately 30 minutes.

At 404, the method 400 may include preheating a bond head coupled with a pick and place tool. When preheating the bond head, the method 400 may include preheating the temperature of the bond head to approximately 25 degrees C. to approximately 160 degrees C.

Method 400 may include, at 406, preheating a bond stage coupled with a carrier capable of holding the package assembly during one or more processes during manufacturing. The carrier may be a metal carrier capable of holding multiple package assemblies. When preheating the bond stage, the method 400 may include preheating the temperature of the bond stage to approximately 45 degrees C. to approximately 120 degrees C.

At 408, the method 400 includes picking and placing the IHS to couple with the package substrate. Using the PPL tool, the IHS may be positioned with respect to an adhesive that may have been applied on the package substrate. At 410, method 400 includes applying heat to the adhesive disposed between the IHS and the package substrate. A preheated bond head and/or a preheated bond stage may be used to heat the adhesive. In one embodiment, when applying heat to the adhesive, the method 400 may further include ramping up the temperature(s) of the bond head and/or bond stage to less than approximately 160 degrees C. The temperature may be set to a higher predetermined temperature to increase the rate of curing of the adhesive, but not as high as to cause STIM that may be coupled to the die and IHS to melt. After a dwell time, the temperature(s) of the bond head and/or bond stage may be fixed or allowed to ramp down.

Method 400 includes, at 412, applying compression to a package assembly comprised of the IHS, the die, the adhesive, and the package substrate. Compression may be applied for a predetermined dwell time. Applying compression to the package assembly may include applying a force of approximately 1 N to approximately 60 N. The method 400 further includes, at 414, without using a clip coupled with the IHS, allowing the adhesive to at least partially cure during applying compression at 412.

Methods 200 and 400 and any sub-steps therein are not necessarily disclosed sequentially and the claimed subject matter is not limited to the order at which steps were presented or described. For example, in one embodiment, if method 200 includes, at 304, applying heat to the bond head and, at 306, applying heat to the bond stage, blocks 304 and 306 may occur simultaneously.

Figure 5:
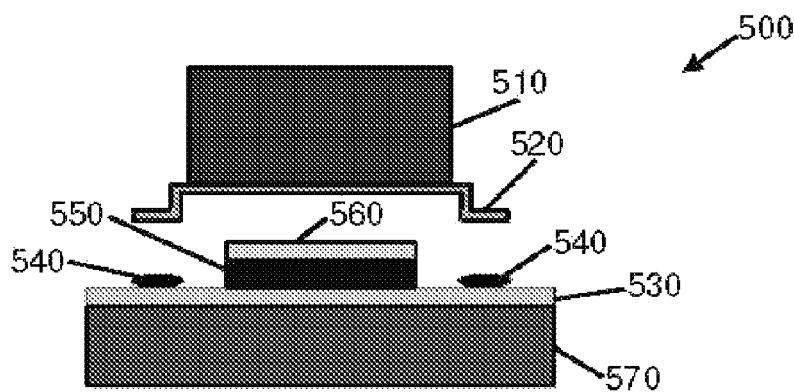
FIGS. 5-7 show elevations of an assembly depicting an integrated heat spreader-attach process according to one embodiment.
Figure 6:
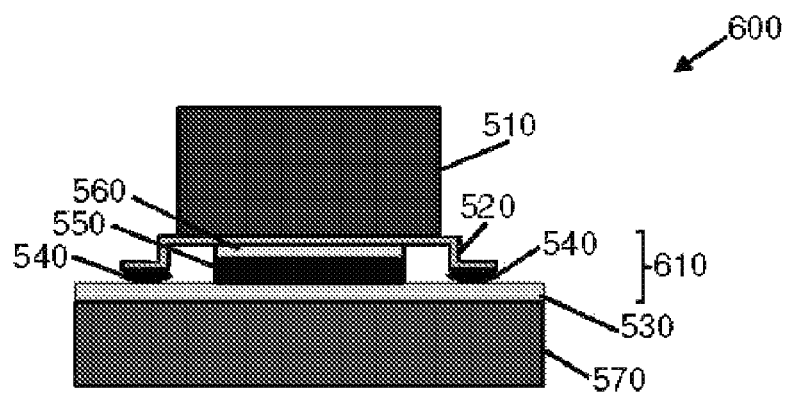
Figure 7:
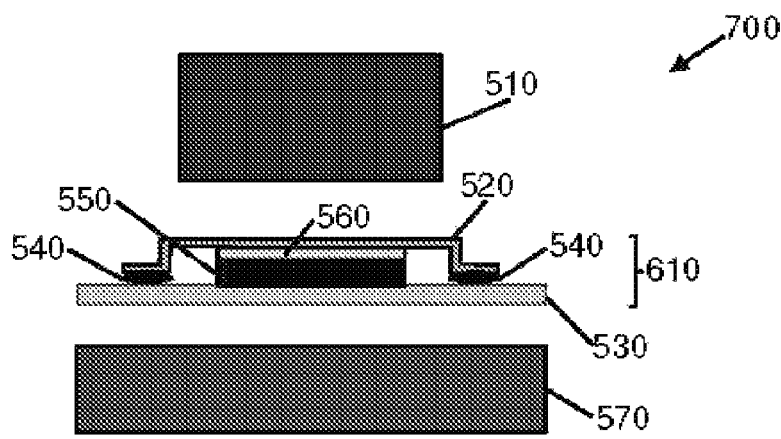

Referring now to FIGS. 5-7, elevations of an assembly depicting an integrated heat spreader-attach ("IHS-attach") process according to one embodiment is shown at 500, 600, and 700. The figures herein are not necessarily drawn to scale and are for purposes of example and discussion. The assemblies 500, 600, and 700 are representations of steps in the IHS-attach process. Since the assemblies 500, 600, and 700 depict the same components, the components are herein referred to with the same numbering.

The assembly 500, 600, and 700 may include a bond head 510 from a PPL tool (only the bond head 510 portion of the PPL tool is shown). The bond head 510 may be capable of picking and placing a lid 520 such as an IHS to assemble a package. The IHS 520 may be coupled to a package substrate 530 via an adhesive 540. The IHS 520 may cover a die 550 with a thermal interface material (TIM) 560 coupled to the top of the die 550. The package substrate 530 may be thermally coupled to a bond stage 570 located on a carrier loaded with one or more die and package substrate sub-assemblies.

The PPL tool may use suction for picking and placing the IHS 520 onto the package substrate 530. Heat and force may be transferred to the die 550 directly from the bond head 510. The heat may be generated inside the PPL tool by a heating element such as an electric heater. When IHS 520 is picked up by the PPL tool, the bond head 510 may be thermally coupled to the IHS 520. The temperature of the bond head 510 may be measured via an internal sensor and electronically controlled. The PPL tool may have the freedom to move in the x, y, z, and θ axes for positioning and may include one or more cameras to facilitate positioning and placement of the IHS 520 over the die 550 and package substrate 530. It will be appreciated that a conventional PPL tool may be modified accordingly or a new tool may be designed to operate in accordance with one or more embodiments disclosed.

Referring to FIG. 5, assembly 500 shows a bond head 510 holding IHS 520. The PPL tool positions the IHS 520 with respect to the adhesive 540, which was previously applied to the package substrate 530, and lowers the IHS 520 towards the package substrate 530. The bond head and the bond stage may be preheated to respective predetermined temperatures, and may be heating respective thermally coupled components. For example, the bond head 570 may be heating the package substrate 530 which in turn is heating the adhesive 540. Once the PPL tool places the IHS 520 in a predetermined position, the PPL tool may apply thermo compression to the IHS 520.

Referring to FIG. 6, assembly 600 shows the application of thermo compression to assemble a package 610 including the IHS 520, the TIM 560, the die 550, the adhesive 540, and the package substrate 530. Assembly 600 may be in the configuration as shown until a dwell time has elapsed. As mentioned above, dwell time is the duration at which simultaneous heat and compression is applied. The dwell time may be predetermined based on temperature, pressure, adhesive, etc.

Assembly 600 shows the adhesive 540 and TIM 560 compressed down during the IHS-attach process after the IHS 520 is placed on top of the die 550 and package substrate 530 and thermo compression is applied. In one embodiment, when the adhesive 540 is applied to the package substrate 530, the adhesive 540 may be approximately 25 mil in thickness (1 mil=25 microns). After the adhesive 540 is compressed, the adhesive 540 may be 9 mil-14 mil in thickness. These values may vary with the TIM used, package selection, and/or other parameters, and the claimed subject matter is not limited in these respects. Various types of TIM may also be compressed to different degrees. For example, in using a polymer-solder hybrid TIM (PSH TIM), the PSH TIM may be compressed to approximately 1.5 mil in thickness, while the STIM may be compressed to approximately 4 mil-8 mil in thickness.

Referring to FIG. 7, assembly 700 shows the removal of thermo compression from the package 610. Thermo compression may be removed from the package 610 after a dwell time has elapsed. In one embodiment, the package 610 may remain thermally coupled to a bond stage 570 located in the carrier. The carrier and any packages that may be coupled to the carrier may be moved to a different location, such as an oven, for a subsequent process, such as a cure and/or reflow process.

Figure 8:
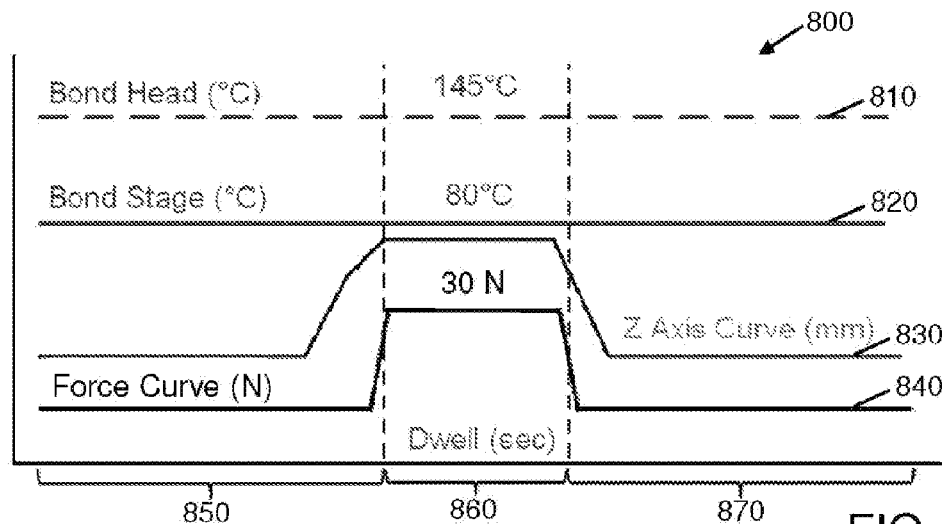
FIG. 8 is a graph showing temperature and force in a steady-state temperature thermo compression process according to one embodiment.

Referring to FIG. 8, a graph showing temperature and force in a steady-state temperature thermo compression process according to one embodiment is shown at 800. The graph 800 shows the relationship of the parameters in accordance with an IHS-attach process. As a function of time, curve 810 represents the temperature of the bond head, curve 820 represents the temperature of the bond stage, curve 830 represents the z axis position of the bond head, and curve 840 represents the force that the bond head applies to the IHS. In a region 850 of graph 800 which may correspond to FIG. 5, the bond head temperature 810 is set to a steady-state temperature of 145 degrees C., and the bond stage temperature 820 is set to a steady-state temperature of 80 degrees C. In region 850, the z axis curve 830 indicates that the bond head holding the IHS lowers toward the package substrate until the first dashed line, which denotes when the dwell time begins. The rate at which the IHS is lowered onto the package substrate does not exceed 1 m/sec. In region 850, the force curve 840 shows an increase in force as the beginning of the dwell time begins.

In a region 860 of graph 800 which may correspond to FIG. 6 where thermo compression is applied, the bond head temperature 810 and the bond stage temperature 820 remain at a steady temperature. The z axis position 830 of the bond head also holds steady throughout the dwell time. In region 860, approximately 30 N is applied during the dwell time.

Region 870 of graph 800 may correspond to FIG. 7 and post application of thermo compression and formation of the package assembly, the bond head temperature 810 and the bond stage temperature 820 still remain at the same temperature. The z axis position 830 indicates the bond head has retracted upwards to an original starting position in region 850. In region 870, the application of force is removed after the dwell time.

Figure 9:
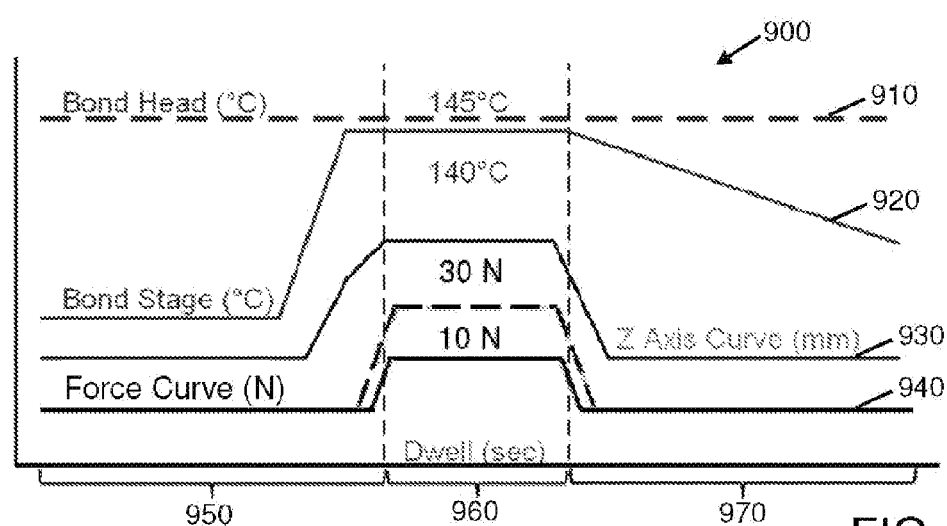
FIG. 9 is a graph showing temperature and force in a ramping temperature thermo compression process according to another embodiment.

Referring to FIG. 9, a graph showing temperature and force in a ramping temperature thermo compression process according to one embodiment is shown at 900. Similar to FIG. 8, the graph 900 shows the relationship of the parameters in accordance with an IHS-attach process. As a function of time, curve 910 represents the temperature of the bond head, curve 920 represents the temperature of the bond stage, curve 930 represents the z axis position of the bond head, and curve 940 represents the force that the bond head applies to the IHS. In a region 950 of graph 900 which may correspond to FIG. 5, the bond head temperature 910 is set to a steady-state temperature of 145 degrees C., and the bond stage temperature 920 is set to ramp up to a temperature of 140 degrees C. In region 950, the z axis curve 930 shows movement of the bond head with the IHS toward the package substrate until the dwell time begins at region 960. The rate at which the IHS is lowered onto the package substrate does not exceed 1 m/sec. In region 950, the force curve 940 shows an increase in force as the beginning of the dwell time begins.

Region 960 of graph 900 may correspond to FIG. 6 where thermo compression is applied. At region 960, the bond head temperature 910 and the bond stage temperature 920 remain at a steady temperature. The z axis position 930 of the bond head remains stationary throughout the dwell time. In region 960, approximately 10 N is applied during the dwell time. Optionally, 30 N may be applied similarly to FIG. 8, however 10 N may be sufficient force for at least partially curing the adhesive.

Region 970 of graph 900 may correspond to FIG. 7 after removal of thermo compression. The bond head temperature 910 remains at the same temperature, while the bond stage temperature 920 cools down. The z axis position 930 indicates the bond head has retracted upwards to an original starting position in region 950. In region 970, the application of force is removed after the dwell time.

It should be noted that FIGS. 8 and 9 are mere examples of parameters that may be used in the IHS-attach process and the claimed subject matter is not limited in these respects. For example, the bond head temperature may also ramp up to a desired temperature, instead of remaining at a steady-state temperature throughout the IHS-attach process.

Figure 10:
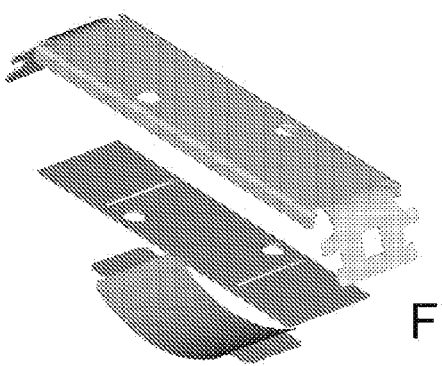
FIG. 10 shows a clip that holds a heat spreader in place during assembly of a package.

Referring now to FIG. 10, an integrated heat spreader-attach ("IHS-attach") process may use a biasing mechanism for applying constant pressure on top of a heat spreader to create a package assembly. For example, as shown in FIG. 10, a biasing mechanism such as a clip may include three parts to exert constant pressure. The clip may be used in order to ensure that intimate contact is maintained between the heat spreader, TIM, and die. This may allow defect-free joints (no voids) after a reflow process. The constant pressure exerted by the clip may be applied until the adhesive between the heat spreader and the package substrate is cured such that a biasing force of the clip is no longer needed to hold the IHS in place with respect to the package substrate. While the adhesive is curing, the package assembly with the coupled clip may be sent to an oven for full curing and/or solder reflow.

Clips are consumables and expire periodically. For example, clips may lose the biasing force depending on frequency of use. Clips need to be measured for span and force prior to use. Clips may need to be picked and placed along with the IHS as a two-layer stack in the pick and place tool and cause frequent clip insertion error affecting efficiency. Clips may increase IHS keep out zone (KOZ) targets due to problems with placement accuracy. Clips do not form part of the package assembly and may have to be removed post reflow and/or cure by a clip removal tool.

In one embodiment, the adhesive between the heat spreader and the package substrate is a quick-cure adhesive capable of partially curing or fully curing in a significantly shorter period of time, thus obviating the need for the use of clips during the IHS-attach process. In one embodiment, the IHS-attach process applies thermo compression to partially cure or fully cure the adhesive without using clips, and may further allow TIM to reflow and/or cure in an oven. When clips are not used such as according to one or more embodiments disclosed, the IHS-attach process may be simplified. The number of steps in the IHS-attach process may decrease and increase efficiency in one or more ways.

Figure 11:
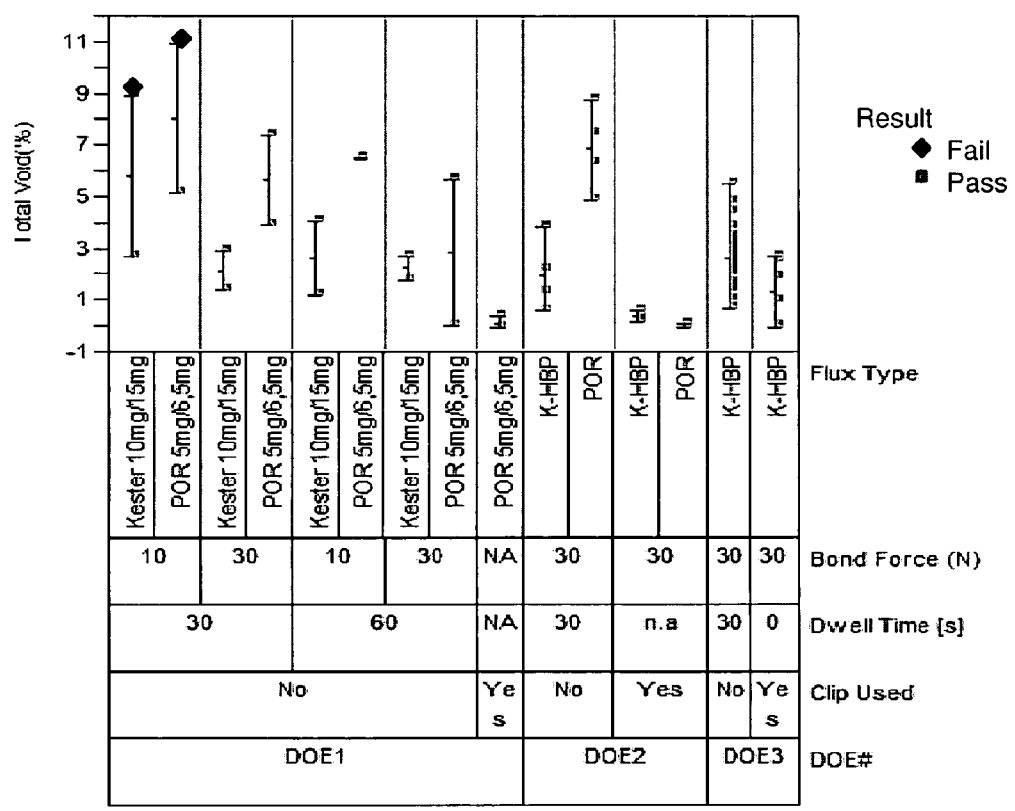
FIG. 11 is a chart showing variability for total voids in a solder-based TIM in various design of experiments.
Figure 12:
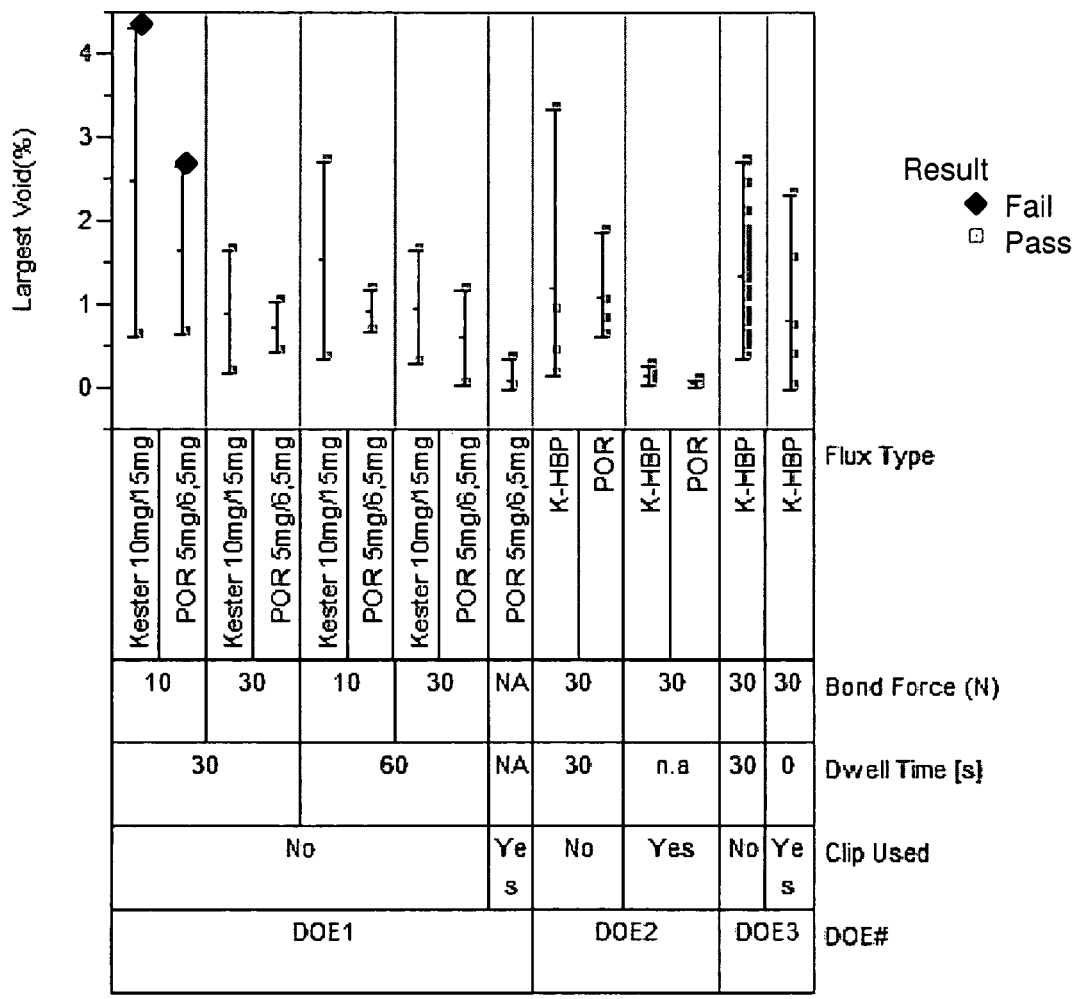
FIG. 12 is a chart showing variability for largest voids in a solder-based TIM in various design of experiments.

Referring to FIGS. 11-12, results of three design of experiments (DOEs) at sequential times completed using Dow Corning's fast cure sealant material EA6800 are shown. FIG. 11 is a chart showing variability for total voids in a solder-based TIM in the three DOEs and FIG. 12 is a chart showing variability for largest voids in a solder-based TIM in the three DOEs. The package assemblies for DOE 2 and DOE 3 meet total and largest void spec. A couple of points in the initial DOE 1 when flux weight was higher than normal do not meet void targets. The results demonstrate suitability of one or more embodiments of the above described clipless IHS process. The dwell times may be further reduced by 1 second to 5 seconds to production levels by increasing the cure kinetics in the adhesive.

It is appreciated that clipless integrated heat spreader process and materials has been explained with reference to one or more exemplary embodiments, and that the claimed subject matter is not limited to the specific details given above. References in the specification made to other embodiments fall within the scope of the claimed subject matter.

Reference in the specification to "an embodiment," "one embodiment," "some embodiments," or "other embodiments" means that a particular feature, structure, or characteristic described in connection with the embodiments is included in at least some embodiments, but not necessarily all embodiments, of the claimed subject matter. The various appearances of "an embodiment," "one embodiment," or "some embodiments" are not necessarily all referring to the same embodiments.

If the specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Those skilled in the art having the benefit of this disclosure will appreciate that many other variations from the foregoing description and drawings may be made within the scope of the claimed subject matter. Indeed, the claimed subject matter is not limited to the details described above. Rather, it is the following claims including any amendments thereto that define such scope and variations.

What is claimed is:

1. A method comprising:
    applying an adhesive to an integrated heat spreader (IHS) or a package substrate capable of carrying a die, and the adhesive being a quick-cure adhesive;
    applying a thermal interface material (TIM) to be disposed between a first side of the die and a first side of the integrated heat spreader (IHS);
    picking and placing the IHS to couple with the package substrate;
    performing a preheating step comprising at least one of a bond head coupled with a pick and place tool, or preheating a bond stage coupled with a carrier capable of holding the package assembly during one or more processes;
    applying heat to the adhesive disposed between the IHS and the package substrate;
    applying thermo compression to a package assembly comprised of the IHS, the die, the adhesive, and the package substrate, said applying thermo compression comprises applying a predetermined amount of heat and force to the second side of the integrated heat spreader (IHS);
    removing the thermo compression from the package assembly of the integrated heat spreader (IHS) when the quick-cure adhesive is at least partially cured;
    fully curing the adhesive without clips coupled with the integrated heat spreader (IHS) to hold the integrated heat spreader (IHS) in place;
    reflowing the TIM in an operation that is separate from curing the quick-cure adhesive; and
    allowing the adhesive to at least partially cure during said applying compression without using the clips coupled with the HIS.

2. The method of claim 1 wherein said preheating a bond head comprises preheating the temperature of the bond head to approximately 25 degrees C. to approximately 160 degrees C.

3. The method of claim 1 wherein said preheating a bond stage comprises preheating the temperature of the bond stage to approximately 45 degrees C. to approximately 120 degrees C.

4. The method of claim 1 wherein said applying heat to an adhesive comprises ramping up the temperature of the bond stage to less than approximately 160 degrees C.

5. The method of claim 1 wherein said applying heat to an adhesive comprises ramping up the temperature of the bond head to less than approximately 160 degrees C.

6. The method of claim 1 wherein said applying compression to a package assembly comprises applying a force of approximately 1 N to approximately 60 N.

* * * * *